(12) United States Patent
Smith et al.

(10) Patent No.: US 7,067,441 B2
(45) Date of Patent: Jun. 27, 2006

(54) DAMAGE-FREE RESIST REMOVAL PROCESS FOR ULTRA-LOW-K PROCESSING

(75) Inventors: Patricia B. Smith, Colleyville, TX (US); Phillip D. Matz, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/702,949

(22) Filed: Nov. 6, 2003

(65) Prior Publication Data

US 2005/0101125 A1    May 12, 2005

(51) Int. Cl.
*H01L 21/469* (2006.01)
(52) U.S. Cl. ............... 438/789; 438/790; 438/706; 438/709
(58) Field of Classification Search ........ 438/778–781, 438/789–790
See application file for complete search history.

(56) References Cited

U.S. PATENT DOCUMENTS

| | | | |
|---|---|---|---|
| 6,028,015 A * | 2/2000 | Wang et al. | 438/789 |
| 6,054,379 A * | 4/2000 | Yau et al. | 438/623 |
| 6,156,671 A * | 12/2000 | Chang et al. | 438/778 |
| 6,277,733 B1 | 8/2001 | Smith | |
| 6,528,432 B1 * | 3/2003 | Ngo et al. | 438/780 |
| 6,602,802 B1 * | 8/2003 | Aoi | 438/778 |
| 6,630,406 B1 | 10/2003 | Waldfried et al. | |
| 2002/0058397 A1 | 5/2002 | Smith et al. | |
| 2003/0104320 A1* | 6/2003 | Nguyen et al. | 430/313 |

OTHER PUBLICATIONS

U.S. Appl. No. 09/199,829 filed Nov. 25, 1998.
U.S. Appl. No. 09/199,600 filed Nov. 25, 1998.
U.S. Appl. No. 10/647,985 filed Nov. 18, 2003.

* cited by examiner

*Primary Examiner*—Dung A. Le
(74) *Attorney, Agent, or Firm*—Jacqueline J. Garner; W. James Brady, III; Frederick J. Telecky, Jr.

(57) ABSTRACT

A process for removing resist (114) from a CDO dielectric material (110) that uses a non-damaging plasma in a reducing atmosphere under high power and using a structure (150) or other means to limit ions from the plasma from reaching the surface of the CDO material (110).

20 Claims, 6 Drawing Sheets

DAMAGE-FREE RESIST REMOVAL PROCESS FOR ULTRA-LOW-K PROCESSING

CROSS REFERENCE TO RELATED APPLICATIONS

The following co-pending application is related and hereby incorporated by reference: Ser. No. 09/975,639; Filing date Oct. 11, 2001; Inventors Smith et al.

FIELD OF THE INVENTION

The invention is generally related to the field of forming interconnect levels in semiconductor devices and more specifically to a resist removal process for use with low-k and ultra-k dielectric materials.

BACKGROUND OF THE INVENTION

Integrated circuit technology continues to advance at a rapid pace, with many circuit technologies being implemented using semiconductor fabrication processes. With the advancement of semiconductor circuit fabrication, consideration is given to various aspects, including maximizing efficiency, lowering manufacturing cost, and increasing performance. With these goals in mind, low dielectric constant (low k) and ultra-low dielectric constant materials are now being considered as favorable for various insulting layers, sometimes referred to as interlevel and intermetal dielectrics, used in a semiconductor circuit. In the past, such insulating layers were implemented using silicon dioxide (i.e., $SiO_2$). Silicon dioxide has a dielectric constant, sometimes referred to in the art by the value k, on the order of 4.0. However, silicon dioxide is now being replaced with progressively lower dielectric constant materials. Carbon-doped oxide (CDO), produced using methylsilsesquioxane (MSQ) precursors with spin-on processes, as well as chemical vapor deposition (CVD) processes using various carbon-containing precursors, is a class of materials having a significantly lower dielectric constant (e.g. commonly 2.2–2.9). In CDO dielectric materials, the regular $SiO_2$ matrix has bonding such as Si—$CH_3$ in the place of some of the Si—O bonds, which lowers the dielectric constant of the material. CDO materials can be made by spin-on or chemical vapor deposition techniques and are sold under various trade names, such as CORAL®, a CVD organo-silicon glass (OSG) commercially available from Novellus Systems, Inc., and Black Diamond™, another CVD material commercially available from Applied Materials, Inc. JSR Corporation also has a CDO which is an MSQ-based spin-on dielectric film known as LKD-5109, with a dielectric constant of 2.2. By reducing the dielectric constant, such as is achieved by these CDO materials, semiconductor devices may be constructed using thinner films for insulating layers. This approach decreases device size and cost. Performance is also increased, such as by way of example where metal lines (e.g., copper) are formed closer together due to the thinness of the low-k or ultra-low-dielectric constant material which separates the metal from other layers/regions/devices.

While CDO materials have advance various goals in the formation of semiconductor circuits, the present inventors have observed a considerable drawback in the use of such low and ultra-low dielectric constant (known as low-k or ultra-low-k) materials. Specifically, during the formation of semiconductor circuits, and as also detailed later, it is known in the art to use photoresist materials as a mask for etching through an insulating layer, such as a silicon dioxide layer, to provide for example, vias, trenches, or other areas through which electrical contact may be made to various points covered by the insulating layer. Once the photoresist has served its masking purpose, it along with any related residue, is removed. This process is sometimes referred to as a clean-up or a strip, and such removal has been achieved in the art by various different processes. However, the present inventors have observed that these traditional photoresist-removal processes, while effective for ordinary silicon dioxide, negatively affect a lower dielectric constant material such as a CDO type of dielectric material. For example, one prior art photoresist-removal process uses an oxygen-based plasma at high temperature, that is, on the order of 250.degree. C. However, when used with a CDO type of dielectric material, the prior art use of an oxygen-based plasma causes the oxygen in the plasma to react with the CDO dielectric material; in other words, rather than being inert with the CDO as is desired, the oxygen may cause the CDO to convert in part to $SiO_2$ and/or to diminish in width and/or in depth. Further complicating this issue is that manufacturers provide CDO-type materials that contain different percentages of, for example, carbon. As a result, the present inventors have observed a corresponding difference in the rate of carbon loss and width and/or depth loss of the CDO type of film when the film is exposed to oxygen-containing plasma. For example, in the past, rates of degradation or loss and width and/or materials were observed on the order of 25 Angstroms per minute exposure to oxygen-containing plasmas while more recently rates of degradation on the order of 100 Angstroms per minute have been observed. Thus, there is a need to reduce this degradation, and indeed such a need will continue should low k materials continue to show degradation on reaction with standard (e.g., $O_2$, 250.degree.C.) photoresist removal processes.

In view of the above, there arises a need to address the drawbacks of the prior art and to provide a method for effectively removing photoresist from low-k and ultra-low dielectric constant materials, as is achieved by the preferred embodiments described below.

SUMMARY OF THE INVENTION

The invention is a process for removing resist from a CDO type of dielectric material that uses a non-damaging plasma in a reducing atmosphere under high power with a grid structure or other suitable means to limit ions from the plasma from reaching the surface of the CDO-type of material. The plasma process may alternatively be applied to other materials containing a significant organic content.

An advantage of the invention is providing a damage-free resist removal process.

This and other advantages will be apparent to those of ordinary skill in the art having reference to the specification in conjunction with the drawings.

DETAILED DESCRIPTION OF THE EMBODIMENTS

Figure 1A:
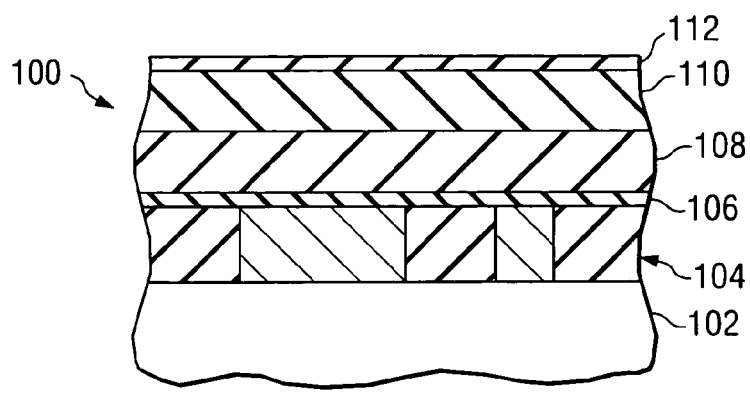
FIGS. 1A–1F are cross-sectional diagrams, not to scale, of a duel damascene process incorporating a resist strip according to the invention at various stages of fabrication.

The invention will now be described in conjunction with a dual damascence process for forming copper interconnects utilizing a low-k or an ultra-low k CDO-type of dielectric. It will be apparent to those of ordinary skill in the art that the benefits of the invention may be applied to other applications in which materials containing significant (e.g., greater than 5 atomic %, and typically 15–25 atomic %, at the surface) organic content, such as materials with Si—R bonding where R is H, $CH_3$, $C_2H_5$, $C_6H_6$ or other organic groups, would be adversely affected by a plasma process capable of physically or chemically removing or altering these materials. removal or alteration in the presence of damaging plasma processes.

One process for stripping photoresist from an FSG (fluorine doped silicate glass) involved the use of an $H_2/N_2$ gas mixture in a plasma at 250° C. The hydrogen-based chemistry effectively removed the resist without negatively interacting with the FSG material. However, when the dielectric material was switched to OSG or CORAL®, a lower k, CDO-type dielectric, the $H_2/N_2$ photoresist removal process at 250° C. resulted in nitrogen poisoning and substantial $CH_3$ loss in the CORAL® dielectric material. The Si—CH3 bonds in the CORAL® material give rise to the low-k property of this material, and its loss leaves an $SiO_2$ matrix and thus increases the dielectric constant. Replacing $H_2/N_2$ plasma gas chemistry with $H_2/Ar$ in the plasma eliminated the nitrogen poisoning. However, some $CH_3$ loss remained although at a decreased level. Applying the $H_2/Ar$ chemistry to the ultra-low-k dielectric material known as JSR LKD-1509, another CDO dielectric material, which is MSQ-based, resulted in a more severe $CH_3$ loss than was observed for CORAL® dielectric material. Accordingly, the $H_2/Ar$ resist strip approach was abandoned in search for a more compatible chemistry. Some success was found with an RIE-like process using $O_2$ plasma.

While attempting to develop a wet clean process that was compatible with the $O_2$ resist strip, a key difference was found between the tools that had been used for CORAL® (OSG) plasma clean and JSR LKD-5109 plasma cleans. The new tool, used for the LKD-5109 plasma cleans, had a 300 mm platform, higher power density capability and a grid. The grid is a cage of metal with slits in it that surrounds the quartz reactor tube. The grid functions to capture the energetic species such as ions produced in the plasma and thus minimize ion exposure of and damage to the materials being processed. The grid had been removed from the prior generation 200 mm platform tool used to plasma clean the CORAL® films post trench and post via dielectric etch in order to achieve higher photoresist etch rates and process a greater number of wafers per hour.

The discovery of a difference in how the 200 mm and 300 mm tools effected CH3 loss from ultra-low-k CDO dielectric films led the inventors to try the previously abandoned $H_2/Ar$ resist strip process that had been used in the 200 mm tool in the new generation 300 mm tool. The new generation tool is capable of providing a higher power density at the wafer. There is roughly a 2X difference in power delivered to the wafer. However, without the discovery of the difference in how wafers processed in each tool with respect to retaining or losing Si—CH3 bonding following exposure of CDO films to a standard wet clean process which followed the plasma process, the increased power density alone would not be expected to produce the result of reduced damage to CDO material observed in the 300 mm tool relative to the 200 mm tool. Since the previously tried process resulted in significant damage to the CDO dielectric, if anything, a higher power density would be expected to cause even more damage through carbon loss in the dielectric film. Spurred on by the discovery of the difference in results for plasma plus wet clean sequences carried out in the two plasma tools (200 mm and 300 mm tools), the inventors were able to develop a resist strip process compatible with CDO dielectrics by using an $H_2/Ar$ chemistry with significantly higher power density delivered to the wafer without increased plasma (ion) damage to the film. The inventors believe this to be possible due to the presence of the grid in the 300 mm version of the process tool, which allowed an ion-free, or truly isotropic plasma condition.

An embodiment of the invention will now be discussed with reference to FIGS. 1A–1F. A semiconductor body 102 is processed through the formation of a first interconnect layer. Semiconductor body 102 typically comprises a silicon substrate having transistors and other elements formed therein. Copper interconnect level 104 may be the first or any subsequent metal interconnect level of the semiconductor device 100.

An etchstop layer 106 is deposited over the first interconnect layer 104. An interlevel dielectric (ILD) 108 is formed over etchstop layer 106. Intermetal dielectric (IMD) 110 is formed over ILD 108. A trench etchstop layer (not shown) may optionally be placed between ILD 108 and IMD 110. ILD 108 and IMD 110 comprise one or more of the CDO-class of dielectrics, such as the MSQ-based spin-on film LKD-5109 available from JSR. In the preferred embodiment, ILD 108 and IMD 110 comprise the same material. However, ILD 108 and IMD 110 may alternatively comprise different materials. A capping layer 112 may be formed over IMD 110 if desired. In the preferred embodiment, the capping layer 112 comprises silicon carbide. Alternatively, a silicon oxide, silicon nitride, silicon oxynitride (SiON), Si-rich nitride (SRN), or no capping layer may be used.

Figure 1B:
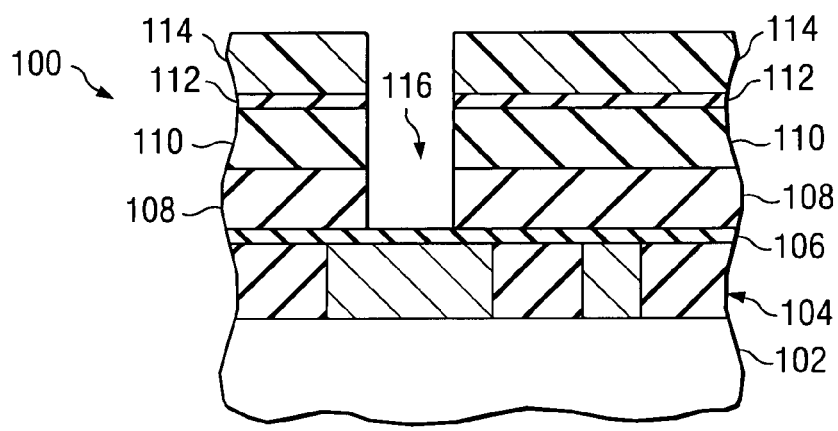

Referring to FIG. 1B, a via resist pattern 114 is formed over capping layer 112. The via 116 is then etched through IMD 110 and ILD 108.

Figure 1C:
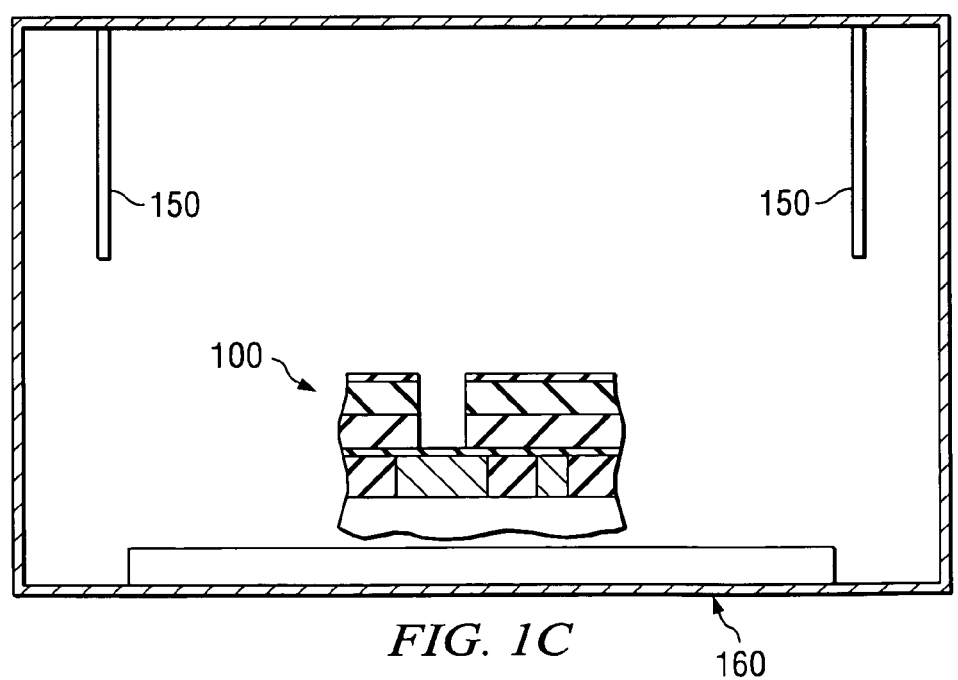

After the via etch, a resist strip according to the invention is performed, as shown in FIG. 1C. A hydrogen-based plasma is used at high plasma density in the strip tool 160 with a structure 150 to capture the charged (ionic) species. In the preferred embodiment, structure 150 comprises a grid arranged to capture the charged species. The term high plasma density is used to refer to the plasma density at the wafer as a result of an RF power in the range of 500–2000 W in an isotropic plasma tool. No bias is applied. The chemistry preferably comprises $H_2$ and a diluent gas such as Ar, He, Ne, or Xe. Nitrogen should not be used as nitrogen tends to cause resist poisoning and is not inert in plasmas interacting with low k dielectric materials such as CDO materials (including spin-on and CVD). A wide range (e.g., 4%–100%) of $H_2$ concentrations may be used.

For the resist strip process, typical pressures may range from 0.3 Torr to 2 Torr. The total gas flow may, for example, range from 1 lpm to 8 lpm. The substrate temperature may, for example, range from 100° C. to 350° C. Substrate temperature affects the removal rate of photoresist. The optimal temperature has been found to be about 250° C. The duration of the process is based on photoresist removal rate (and thus temperature) and the amount of photoresist to be removed. A typical process time is in the range of 2 to 3 minutes. Plasma generation using microwave or radio frequency, or other suitable frequency, may be used.

In the preferred embodiment, an Aspen III platform available from Mattson Technology, Inc. is used as it includes a grid and is capable of providing the high density plasma and handling up to 100% H2 gas flow in the plasma. Using this tool, the preferred settings include a temperature of 250° C., a duration or 180 seconds, a pressure of 700 mT, a ICP power of 1250 W, and gas flows of 3960 sccm $H_2$, and 2640 sccm Ar (60% $H_2$ by volume). The above process is a damage-free resist strip even in the case where no capping layer is present. While an RF power tool is used here, isotropic plasma tools could be used as well.

Figure 2:
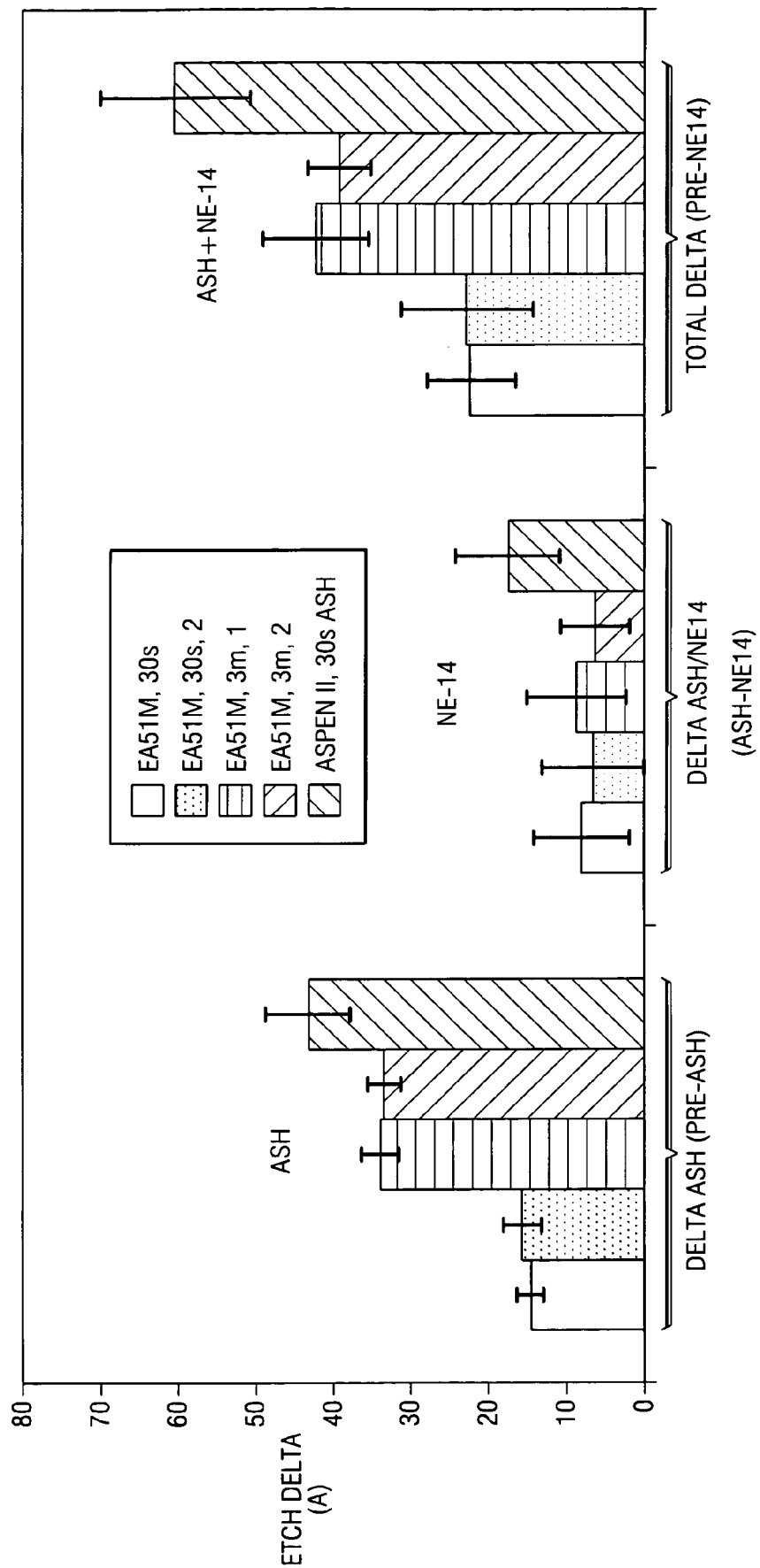
FIG. 2 is a graph of damage to a CVD Novellus CORAL® film in terms of film thickness change (Etch Delta (A)) measured following various plasma resist strip and wet clean process parameters.

The resist strip is preferably followed by a wet clean. In the preferred embodiment, Air Products formerly Ashland-ACT Corporation chemical solvent clean known as NE-14™ is used for the wet clean. Other suitable solvents, such as ST-250 available from ATMI, Inc., are known in the art. FIG. 2 is a graph showing the change in film thickness (etch delta) measured for various resist strip conditions from a CORAL° film experiencing plasma only and a combination plasma exposure plus an NE-14™ wet clean. EA51M in the figure refers to an Aspen III 300 mm platform ICP plasma tool. As shown in FIG. 2 there is significantly less damage with a 3 minute ash (resist strip) in the Aspen III platform as compared to a 30 second strip in the Aspen II. Approximately 40 A film thickness change was observed for samples of CORAL® films exposed to a 3 minute 250° C. H/Ar ash and a 3' ash followed by a 1 minute 27° C., NE-14™ clean, compared with 60 A film loss for 30 sec of 250° C. H/Ar ash in the 200 mm tool. No additional damage was observed for samples of CORAL® films that had been exposed to a 3 minute 250° C. H/Ar ash in the 300 mm tool followed by a 1 minute 27° C., NE-14™ clean.

Continuing with the process flow, in order to protect the bottom of via 116 during the subsequent trench etch, via 116 may be partially or completely filled. For example, an organic BARC (bottom anti-reflection coating) 117 may be deposited over the structure and etched back such that BARC material remains only in the via 116.

Figure 1D:
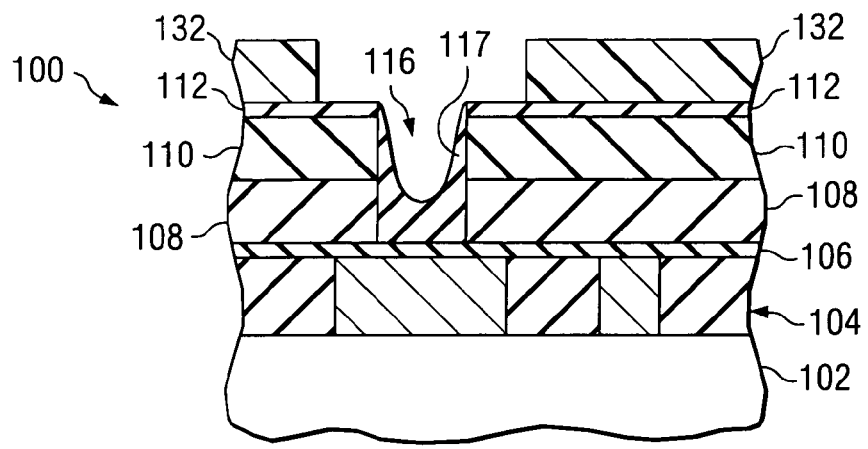
Figure 1E:
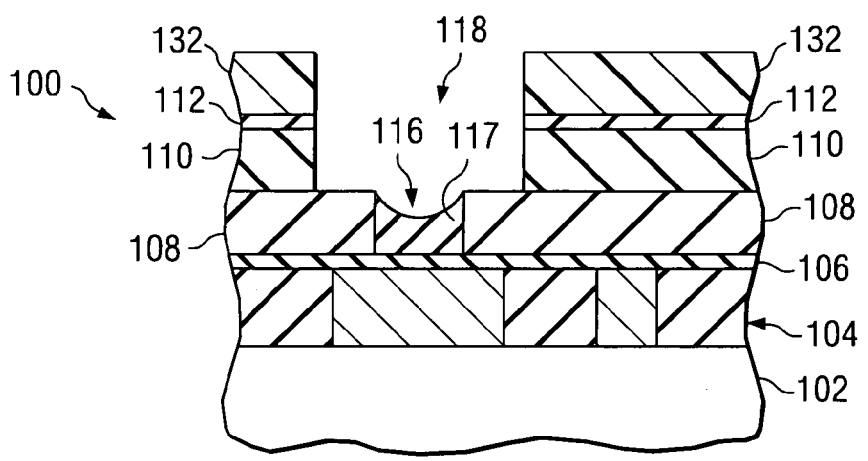

Next, a trench pattern 132 may be formed over IMD 110, as shown in FIG. 1D. After trench pattern, a trench 118 is etched in IMD 110, as shown in FIG. 1E. Trench pattern 132, and BARC 117 are then removed. The resist strip process according to the invention as described above for removing the via pattern may be used to remove the trench pattern 132 and BARC 117. The resist strip process may also be used for any resist pattern reworks. The capping layer 112 and etchstop layer 106 are removed next during an etchstop etch. Copper interconnect structures will subsequently be formed in trench 118 and via 116.

Barrier layer 120 is deposited over IMD 110 including in trench 118 and via 116. Barrier layer 120 functions to prevent copper diffusion into the ILD and IMD layers. Suitable barrier materials such as Ta/TaN, Ti/TiN, TiW, and combinations and other such barrier materials are known in the art.

A seed copper layer is then deposited over barrier layer 120. Electrochemical deposition (ECD) may then be used to deposit copper layer 124. Various copper ECD processes are known in the art.

Figure 1F:
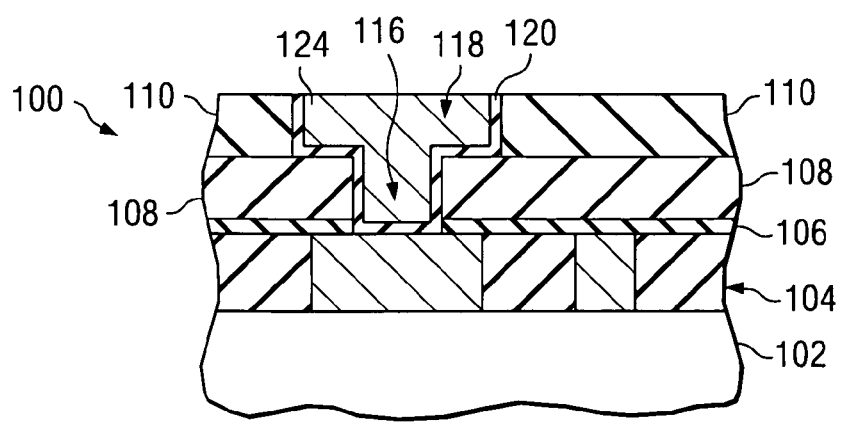

After copper ECD, the copper 124 and barrier 120 are chemically and mechanically polished (CMP) to remove the material from above IMD 110. The resulting structure is shown in FIG. 1F. Next level ILD and IMD may be deposited and processing may then continue to form additional metal interconnect levels and package the device.

Experimental Results

Figure 3:
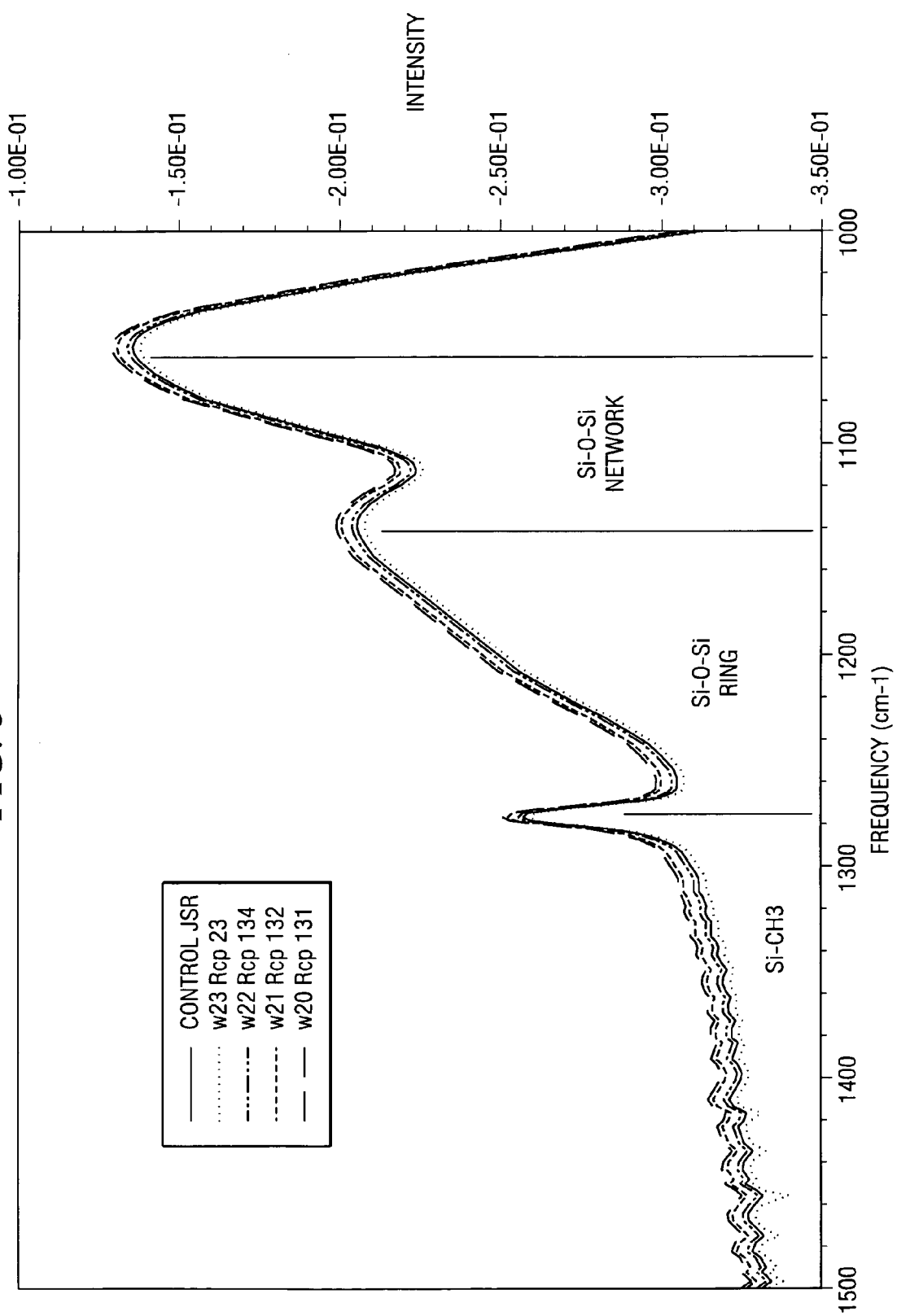
FIG. 3 is a graph showing minimal change in the Si—O and Si—CH3 bonding in Fourier Transform Infrared spectroscopy (FTIR) data obtained following exposure of spin-on films of LKD-5109 (JSR Corporation) to plasma processes performed in an ion-free plasma using H/Ar of H/He gas mixtures over a range of process conditions.

FIG. 3 illustrates FTIR spectroscopic data taken from processes run with variations in process time, ICP (RF) power, and the use of Ar and He as diluent gases used with 60% by volume H2 in the plasma. Similar FTIR spectra have also been obtained showing no discernable change to LKD-5109, BD2 or CORAL® films over a range of RF power, pressure, and gas composition. All have similar results showing no change in the FTIR spectra compared with control films that had not been exposed to plasma processing.

Process Parameters for the Recipes Referred to in FTIR Data of FIG. 3

| Recipe | Pressure | ICP Power (W) | Time (sec.) | $H_2$ Flow (sccm) | Ar Flow (sccm) | He Flow (sccm) |
|---|---|---|---|---|---|---|
| 23 | 700 mT | 1250 | 180 | 3960 | 2640 | 0 |
| 134 | 700 mT | 1500 | 180 | 3960 | 0 | 2640 |
| 132 | 700 mT | 1250 | 180 | 3960 | 0 | 2640 |
| 131 | 700 mT | 1500 | 300 | 3960 | 2640 | 0 |

Figure 4:
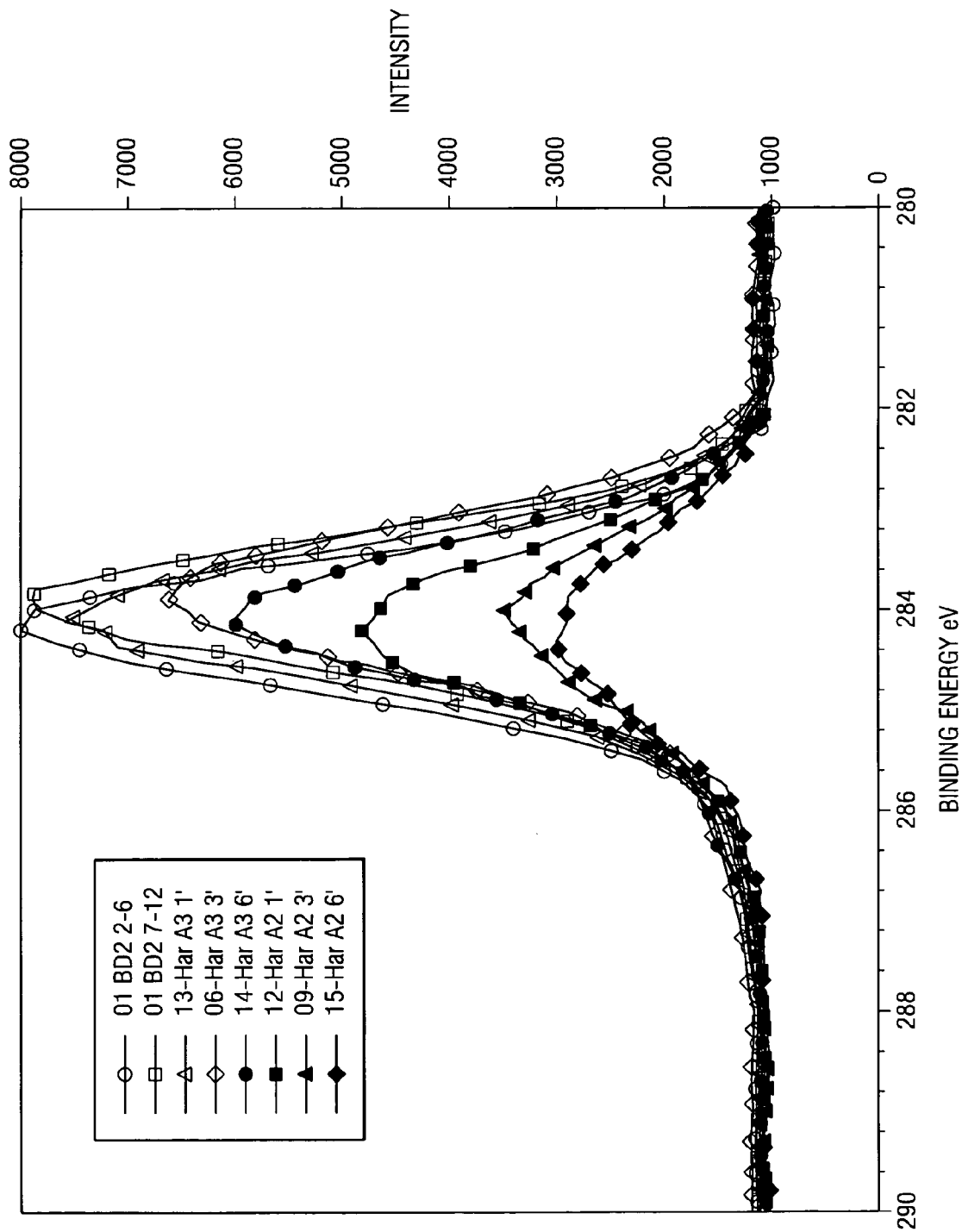
FIG. 4 is a collection of X-ray photoelectron spectra (XPS) showing carbon 1$s$ spectra obtained from Applied Materials' Black-Diamond 2 (BD2) films. The data shows little surface C loss from isotropic H/Ar plasma exposures in an Aspen III (A3) inductively coupled plasma (ICP) tool and greater loss from H/Ar plasmas from an Aspen II (A2) ICP Mattson tool in which the ion-collecting grids were removed, therefore exposing the film to some ion content.

FIG. 4 is a collection of X-ray photoelectron spectra (XPS) showing carbon 1s spectra obtained from BD2 films. The data shows little surface C loss from isotropic H/Ar plasma exposures in an Aspen III (A3) tool and greater loss from H/Ar plasmas from an Aspen II (A2) Mattson tool in which the ion-collecting grids were removed, therefore exposing the film to some ion content.

Figure 5:
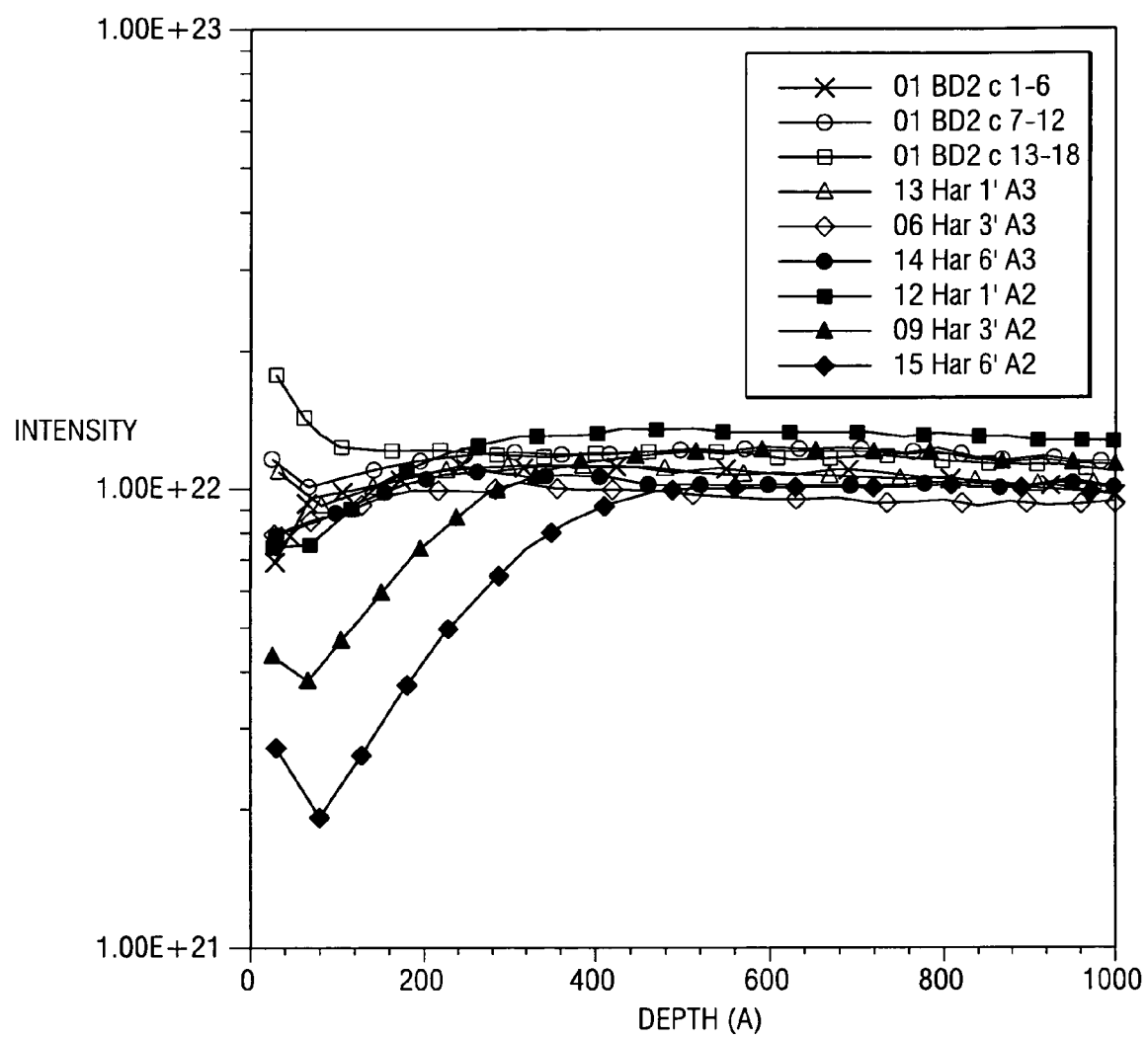
FIG. 5 is a collection of secondary ion mass spectroscopy (SIMS) carbon depth profile data obtained from BD2 films following exposure to 60% H/40% Ar plasmas in an Aspen III (A3) ICP tool in which ion collecting grids were present and Aspen II (A2) ICP tool in which the grids were removed. No subsurface carbon loss is observed from the films exposed to the A3 plasma, and C loss up to 400 A depth in the BD2 films was observed for up to 6' plasma exposure using the same process in the A2 tool.

FIG. 5 is a collection of secondary ion mass spectroscopy (SIMS) carbon depth profile data obtained from BD2 films following exposure to 60% H/40% Ar plasmas in an Aspen III (A3) tool in which ion collecting grids were present and Aspen II (A2) tool in which the grids were removed. No subsurface carbon loss is observed from the films exposed to the A3 plasma, and C loss up to 400 A depth in the BD2 films was observed for up to 6' plasma exposure using the same process in the A2 tool.

While this invention has been describe with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method for fabricating an integrated circuit, comprising the steps of:
   depositing an organic containing material comprising greater than 5% Si—R bonding at a surface, where R is H, $CH_3$, $C_2H_5$, $C_6H_6$ or other organic group;
   subjecting said organic containing material to a hydrogen plasma with a power of at least 500 W and uses a structure to limit ions from the hydrogen plasma from reaching the organic containing material.

2. A method for fabricating an integrated circuit, comprising the steps of:
   depositing a carbon-doped oxide (CDO) material over a semiconductor body;
   forming a resist pattern over said CDO material;
   etching said CDO material using said resist pattern;
   removing said resist pattern using a hydrogen plasma with a power in the range of at least 500 W and uses a structure to limit ions from the hydrogen plasma from reaching the CDO material.

3. The method of claim 2, wherein said CDO material is a methylsilsesquioxane (MSQ)-class material.

4. The method of claim 3, wherein said MSQ-class material comprises JSR LKD-5109.

5. The method of claim 2, wherein said CDO material comprises organo-silicon glass.

6. The method of claim 2, wherein said CDO material comprises CORAL®.

7. The method of claim 2, wherein said CDO material comprises Black Diamond™.

8. The method of claim 2 wherein said hydrogen plasma comprises $H_2$ and an inert diluent gas.

9. The method of claim 8, wherein said inert diluent gas is selected from the group consisting of Ar, He, Ne, or Xe.

10. The method of claim 2, wherein said step of removing said resist pattern occurs at a temperature in the range of 100° C. to 350° C.

11. The method of claim 2, wherein said step of removing said resist pattern exposes said CDO material to said hydrogen plasma for a duration on the order of 3 minutes.

12. The method of claim 2, wherein said hydrogen plasma comprises $CH_4$.

13. The method of claim 2, wherein a concentration of hydrogen in said hydrogen plasma is in the range of 4% to 100% by volume.

14. The method of claim 2, wherein said structure comprises a grid.

15. A method for fabricating an integrated circuit, comprising the steps of:
   depositing a CDO material over a semiconductor body;
   forming a resist pattern over said CDO material;
   etching said CDO material using said resist pattern;
   removing said resist pattern using a plasma of $H_2$ with or without an inert diluent gas, wherein said plasma creates a high plasma density at said CDO material and uses a structure to limit ions from the plasma from reaching the CDO-based material; and
   cleaning said CDO material using a wet clean.

16. The method of claim 15, wherein said CDO material is selected from the group consisting of MSQ-based spin-on dielectrics and CVD OSGs.

17. The method of claim 15 wherein a concentration of said $H_2$ is in the range of 4%–100%.

18. The method of claim 15, wherein said wet clean comprises NE-14™.

19. The method of claim 15, wherein said wet clean comprises ST-250.

20. The method of claim 15, wherein said structure comprises a grid.

* * * * *